US006472921B1

United States Patent
Rao et al.

(12) United States Patent
(10) Patent No.: US 6,472,921 B1
(45) Date of Patent: Oct. 29, 2002

(54) DELIVERING A FINE DELAY STAGE FOR A DELAY LOCKED LOOP

(75) Inventors: Rajashekhar Rao; Patrick Heyne, both of Munich (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/871,855

(22) Filed: May 31, 2001

(51) Int. Cl.[7] .................................................. H03K 3/00
(52) U.S. Cl. ...................................... 327/237; 327/233
(58) Field of Search ................................. 327/237, 233, 327/246, 247, 269, 270, 274, 150, 159, 278

(56) References Cited

U.S. PATENT DOCUMENTS

| | | | | |
|---|---|---|---|---|
| 4,118,741 A | * | 10/1978 | Gomi et al. | 348/505 |
| 4,128,817 A | * | 12/1978 | Gomi | 331/116 R |
| 5,015,872 A | * | 5/1991 | Rein | 327/202 |
| 5,489,869 A | * | 2/1996 | Mulbrook | 327/246 |
| 6,285,228 B1 | * | 9/2001 | Heyne et al. | 327/231 |
| 6,385,265 B1 | * | 5/2002 | Duffy et al. | 327/148 |

FOREIGN PATENT DOCUMENTS

| | | |
|---|---|---|
| DE | 199 9801 | 6/1999 |
| DE | 199 29801 | 6/1999 |

* cited by examiner

Primary Examiner—Timothy P. Callahan
Assistant Examiner—Linh Nguyen
(74) Attorney, Agent, or Firm—Fish & Richardson P.C.

(57) ABSTRACT

A circuit, for use in a delay locked loop, provides a phase-shifted output relative to a first signal. The circuit includes plural current sources, current source switches that are selectable to transmit varying amounts of current from the plural current sources, and input switches that receive current via the current source switches and provide the phase-shifted output. The output switches include a first switch for receiving the first signal and a second switch for receiving a second signal phase-shifted from the first signal. The phase-shifted output relative to the first signal is based on an amount of current that passes through each input switch.

22 Claims, 8 Drawing Sheets

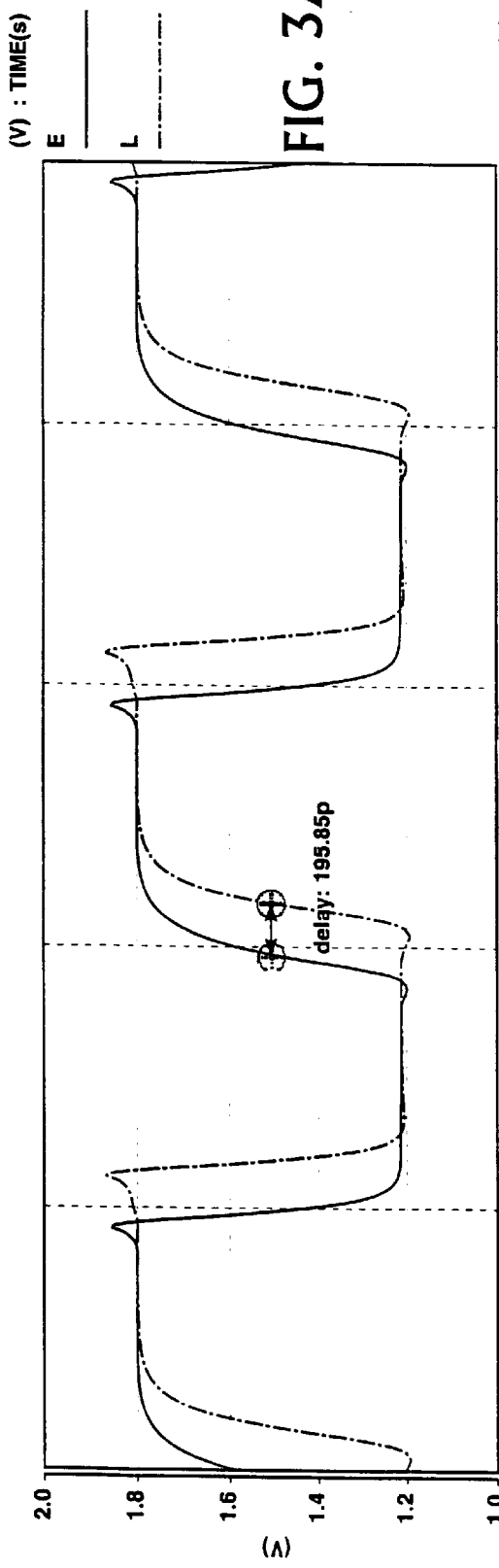
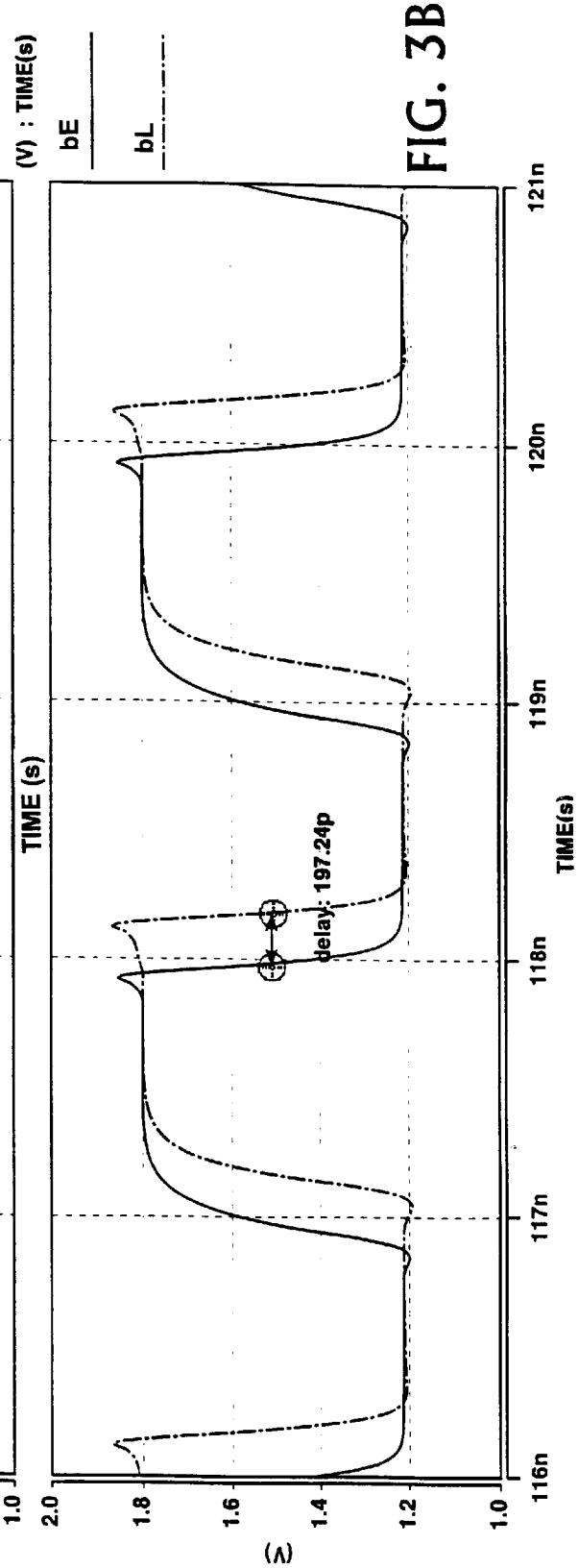

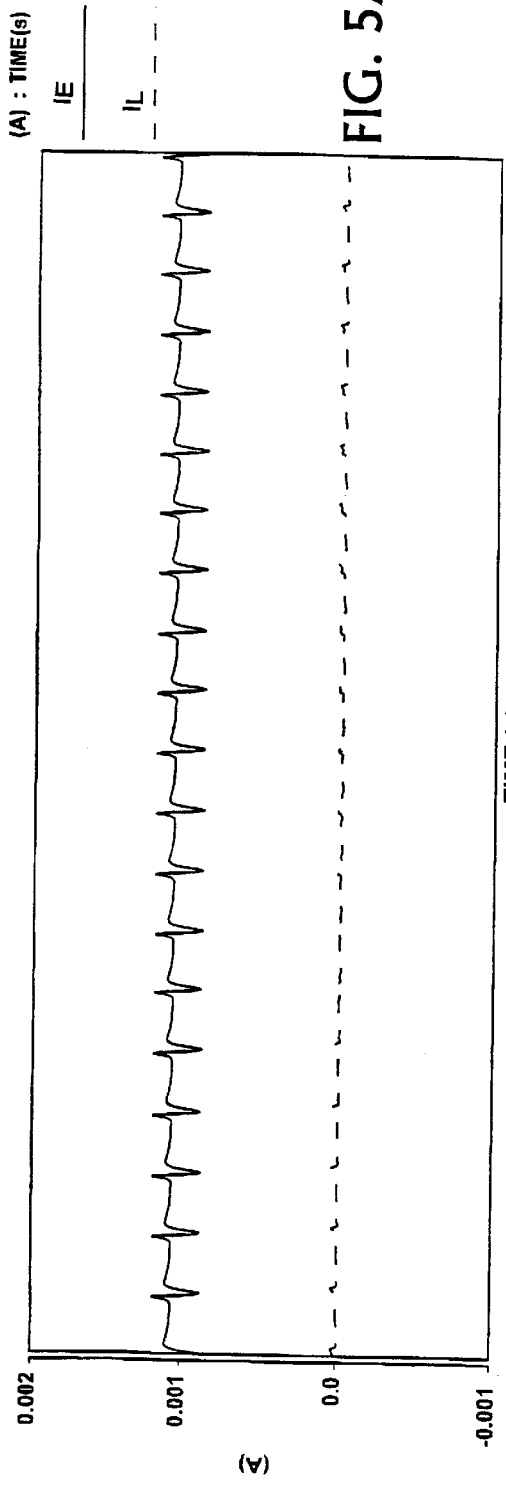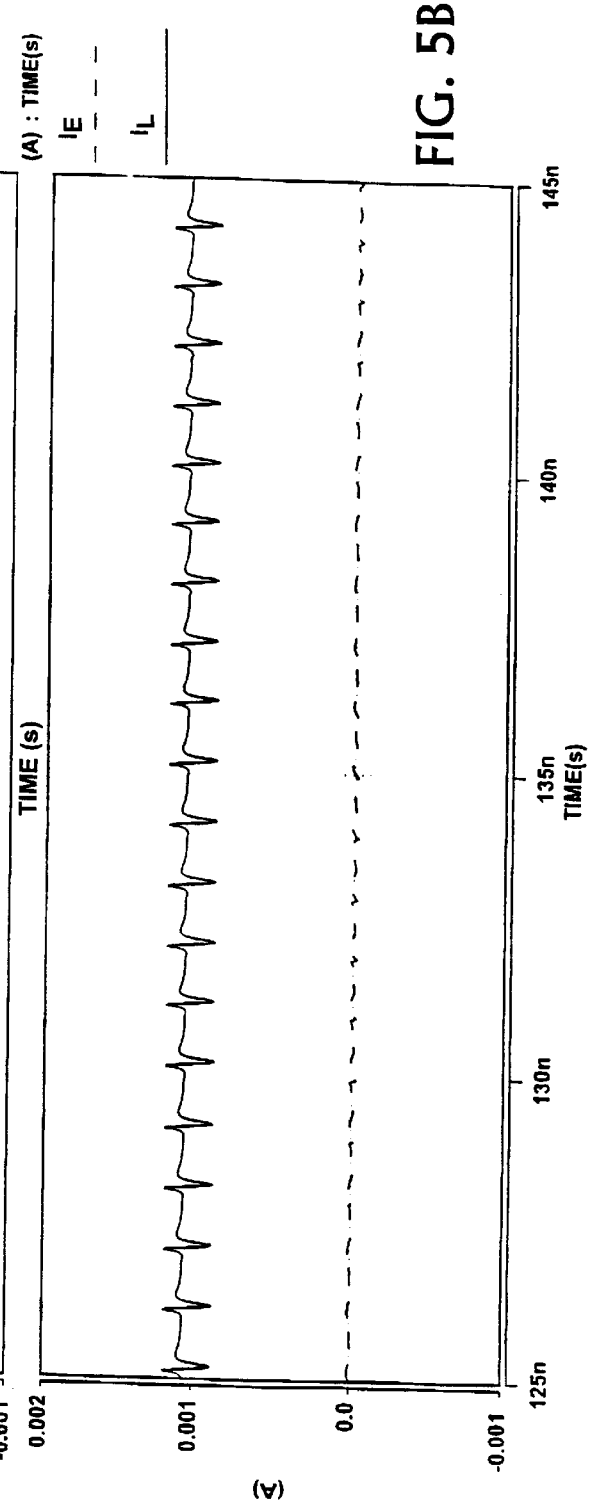

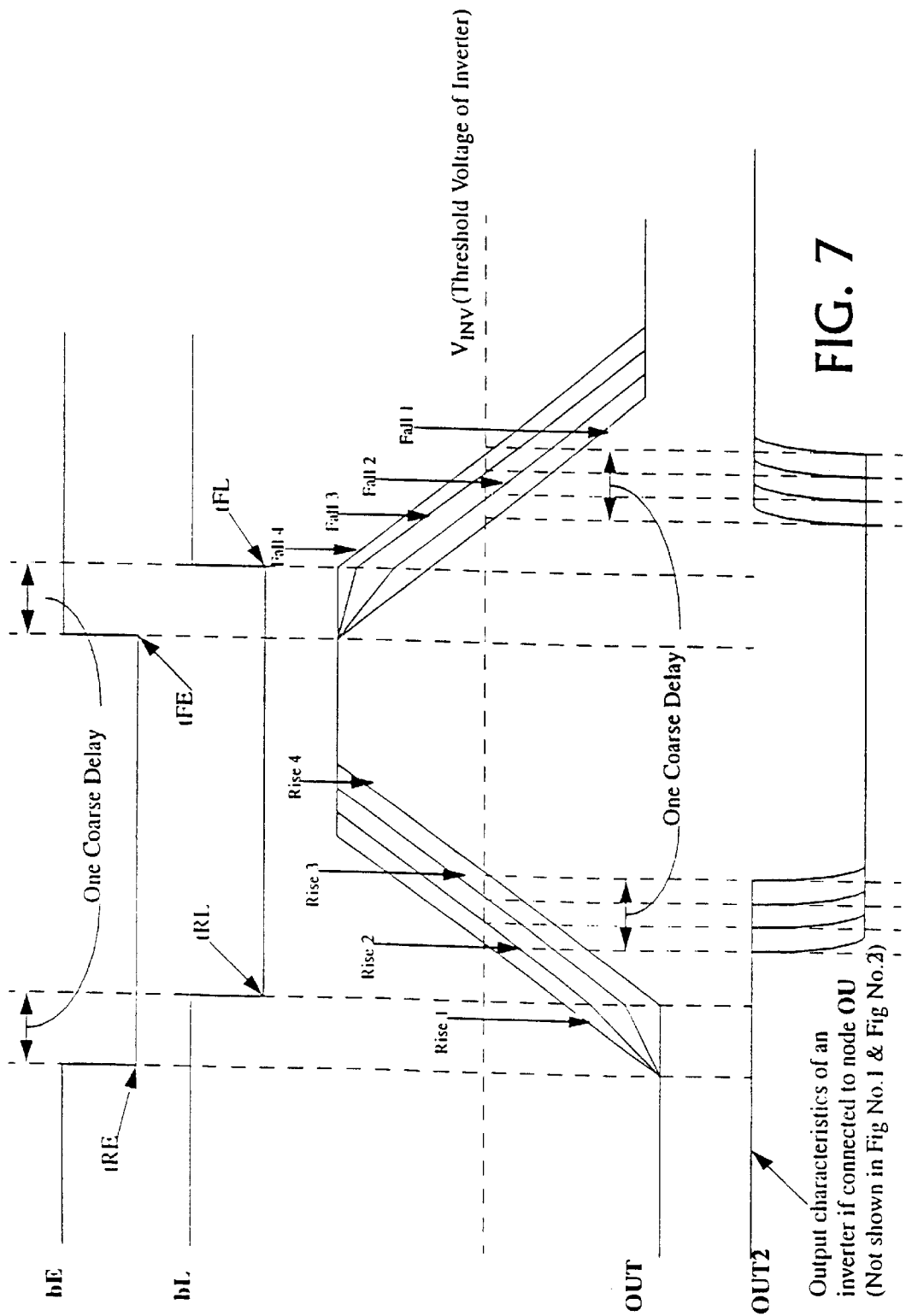

Block Diagram of DLL

Delay Line

DELIVERING A FINE DELAY STAGE FOR A DELAY LOCKED LOOP

TECHNICAL FIELD

This invention relates to delivering a fine delay stage for a delay locked loop (DLL) that incrementally varies the phase shift of input and output voltages.

BACKGROUND

Double data rate synchronous dynamic random access memory (SDRAM) is available today in new memory integrated circuits that are designed with DLLs. Among their many applications, DLLs perform synchronization in a delay chain having the amount of fixed unit delays changed by a controller which evaluates a phase detector. DLLs have commonly been designed to have a coarse delay stage and fine delay stage where a coarse delay stage is larger than a fine delay stage. Since a coarse delay is process dependent, a coarse delay cannot be made very small to improve the resolution of the DLL, so a fine delay stage is used to improve the resolution.

SUMMARY

The invention relates to a circuit that produces a fine delay stage for a DLL and a corresponding method that incrementally varies the phase shift of input and output voltages to achieve the fine delay stage.

In general, in one aspect, the invention is directed to a fine delay unit circuit, for use in a DLL, that provides a phase-shifted output relative to a first signal. The circuit includes plural current sources, current source switches that are selectable to transmit varying amounts of current from the plural current sources, and input switches that receive current via the current source switches and provide the phase-shifted output. The output switches include a first switch for receiving the first signal and a second switch for receiving a second signal phase-shifted from the first signal. The phase-shifted output relative to the first signal is based on an amount of current that passes through each input switch.

This aspect may include one or more of the following features. Each current source may be a constant current source. The plural current sources may include a first current source and a second current source. The second current source may generate twice as much current as the first current source. Each additional current source may generate current $2^N$ times greater than the first current source.

Each current source may include a first transistor. Each current source switch may include a first transistor and a second transistor. The second transistor may receive a fourth signal that is complementary to a third signal received by the second transistor. The first input switch may include a first transistor and a second transistor. The second input switch may include a third transistor and fourth transistor. The first transistor may receive the first signal and the second transistor may receive a third signal complementary to the first signal. The third transistor may receive the second signal and the fourth transistor may receive a fourth signal complementary to the second signal.

In general, in another aspect, the invention is directed to a method that provides a phase-shifted output relative to a first signal in a DLL. The method includes selecting varying amounts of current from plural current sources by enabling current source switches, and transmitting a first signal to a first input switch and a second signal, phase-shifted from the first signal, to a second input switch. Using this method, the phase-shifted output relative to the first signal is based on an amount of current that passes through the first input switch and the second input switch.

DESCRIPTION OF THE DRAWINGS

FIG. 3A is a graph of the relationship of input signals E and L (FIG. 2) to the circuit of FIG. 2.

FIG. 3B is a graph of the relationship of input signals bE and bL (FIG. 2) to the circuit of FIG. 2.

FIG. 5A is a graph of the relationship of $I_E$ and $I_L$ in FIG. 4A.

FIG. 5B is a graph of the relationship of $I_E$ and $I_L$ in FIG. 4B.

FIG. 7 is a graph showing the relationship of the current switches of FIG. 1 to the generation of fine delay steps.

DETAILED DESCRIPTION

Figure 1:
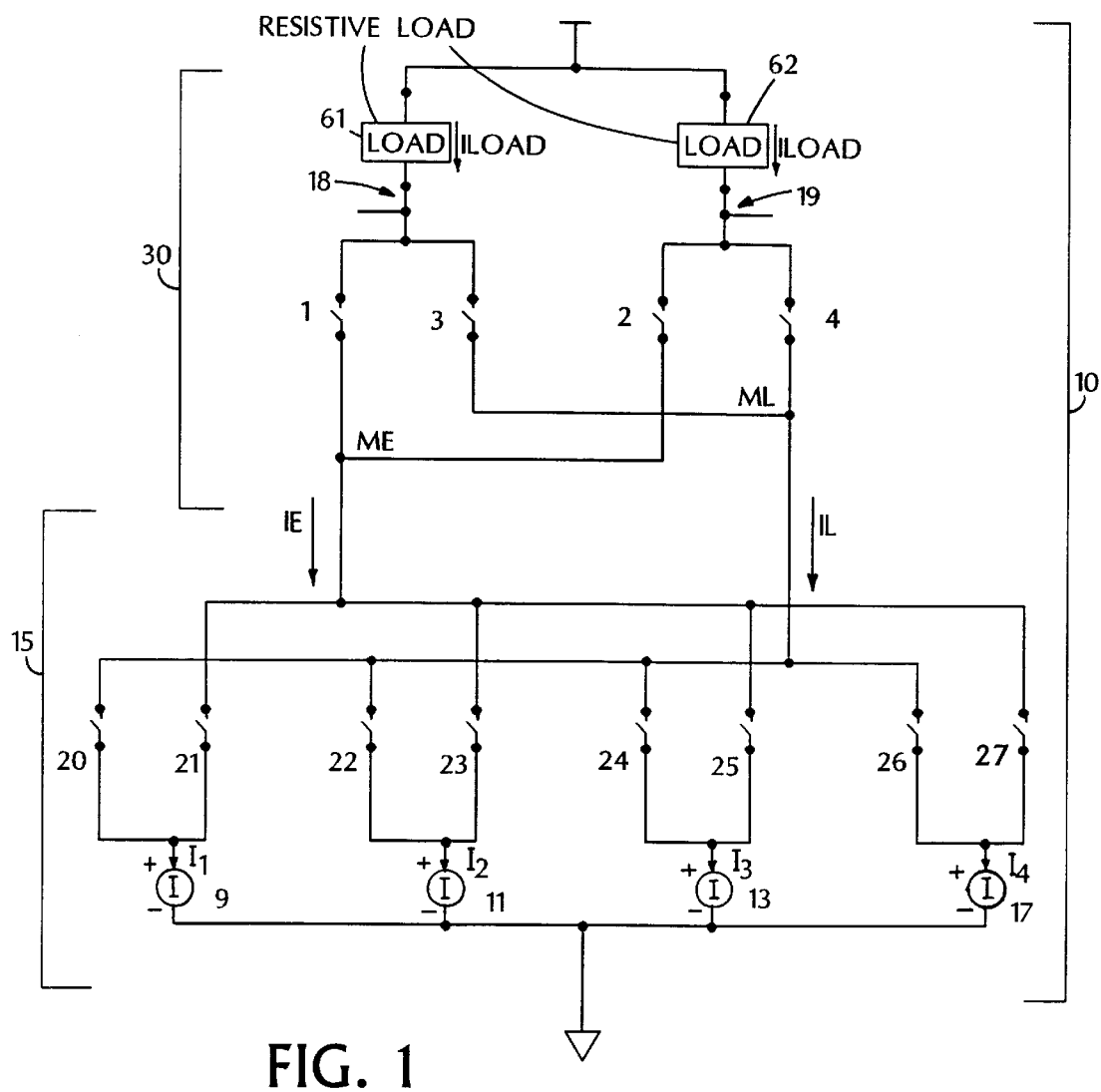
FIG. 1 is a schematic of a circuit for generating fine delay stages in a DLL.

Referring to FIG. 1, a fine delay circuit for a DLL is shown. Circuit 10 contains an adjustable current source 15 that provides two output currents, $I_E$ and $I_L$. Adjustable current source 15 contains constant current sources 9, 11, 13, and 17, which produce currents $I_1$, $I_2$, $I_3$, and $I_4$, respectively, and current source switches 20, 21, 22, 23, 24, 25, 26, and 27. Switches 20, 22, 24, and 26 receive signals S0 to S3. Switches 21, 23, 25, 27 receive signals bS0, bS1, bS2, and bS3, which are complementary to signals S0 to S3. What is meant by complementary is that when one signal is high, its complementary signal is low, and vice versa.

Circuit 10 includes input switches 1, 2, 3, and 4. Input switch 1 receives a first input clock signal E, input switch 3 receives a signal bE that is complementary to signal E, input switch 2 receives a second input clock signal L that is phase-shifted from signal E, and input switch 4 receives a signal bL that complementary to signal L. The phase shift between signals E and L is equal to one coarse delay T. Fine delay circuit 10 produces an output voltage OUT that is phase-shifted from signal E.

Activating and deactivating current source switches 20, 21, 22, 23, 24, 25, 26, and 27 changes the phase shift of signal OUT relative to signal E. Coarse delay T is defined as the difference of the minimum phase shift between signal E and signal OUT when current source signals to switches 20, 22, 24, 26 are low (the switches are open) and the current source signals to 21, 23, 25, and 27 are high (the switches are closed) and the maximum phase shift between signals E and OUT when current source signal 20, 22, 24, 26 are high (the switches are closed) and current source signals to switches 21, 23, 25, and 27 are low (the switches are open).

Figure 2:
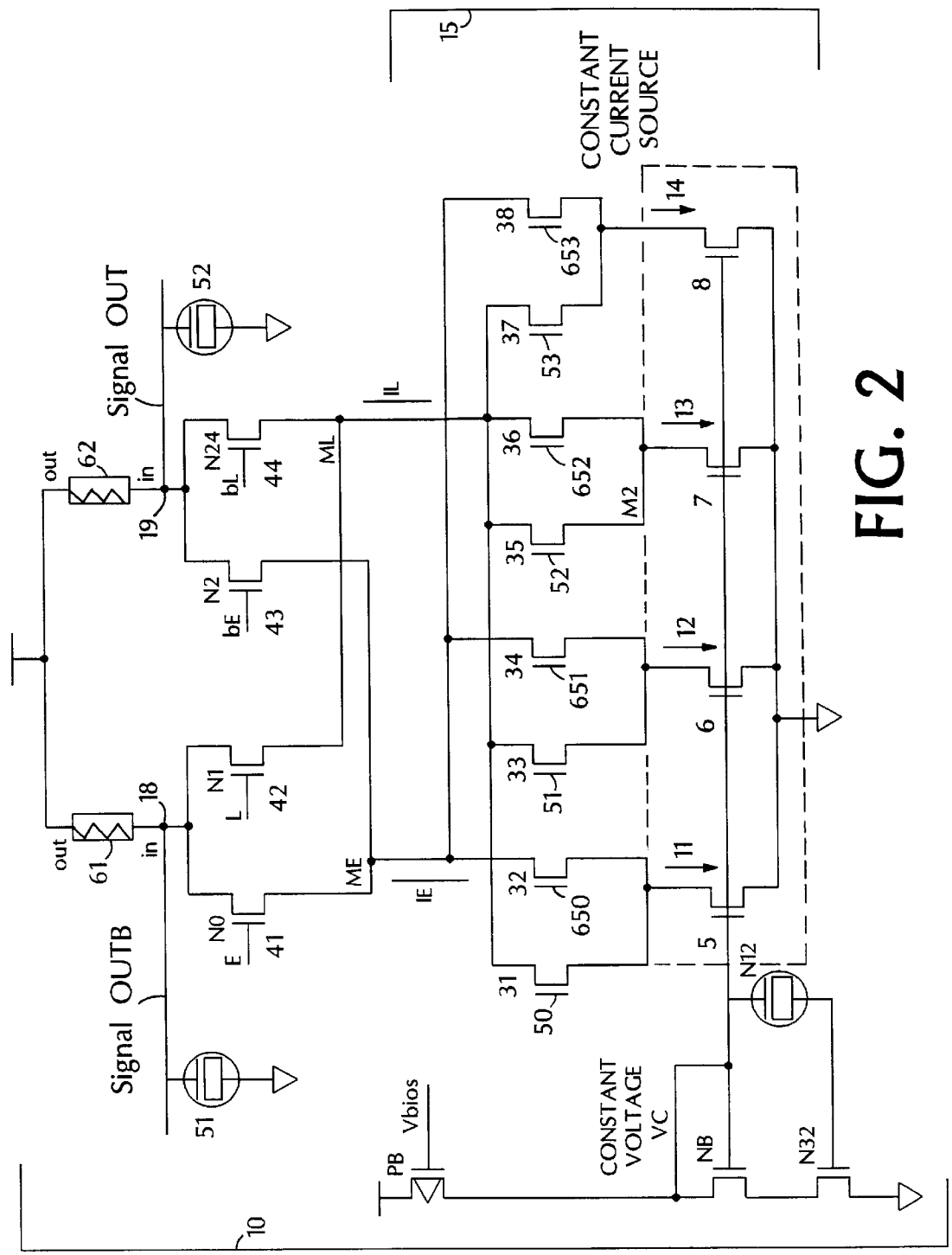
FIG. 2 is a schematic showing one embodiment of the circuit of FIG. 1.

Referring to FIGS. 1 and 2, constant current sources 9, 11, 13, and 17 include n-channel transistors 5, 6, 7, and 8 respectively. The gate terminals of these transistors are connected to a constant voltage potential, VC. The constant current sources $I_1$, $I_2$, $I_3$, and $I_4$ are binary weighted. That is, transistor 6 has twice the conductivity of transistor 5, transistor 7 has twice the conductivity of transistor 6, and transistor 8 has twice the conductivity of transistor 7. In other words, if transistor 5 produces current $I_1$, then transistor 6 produces a current $2I_1$, transistor 7 produces a current $4I_1$ and transistor 8 produces a current, $8I_1$. If additional transistors are added, the additional transistors would produce $2^N I_1$ current, if desired.

Each constant current source is connected to a pair of current sources switches. Thus, current source $I_1$ connects to current source switches 20 and 21, current source $I_2$ connects to current source switches 22 and 23, current source $I_3$ connects to current source switches 24 and 25, and current source $I_4$ connects to current source switches 26 and 27. Each pair of switches is comprised of two transistors. The gates of transistors 31, 33, 35, and 37 receive signals S0–S3 and the gates of transistors 32, 34, 36, and 38 receive the complementary signals bS0–bS3.

The drain terminals of the constant current source transistors 5, 6, 7, and 8 connect to the current source switch at the source of the of n-channel transistors 31, 32, 33, 34, 35, 36, 37, and 38. That is, transistor 5 connects to transistor 31 and transistor 32, transistor 6 connects to transistor 33 and transistor 34, transistor 7 connects to transistor 35 and transistor 36, and transistor 8 connects to transistor 37 and transistor 38. FIGS. 3A and 3B show the relationship of signals E, L, bL, and bE in Circuit 10.

Referring back to FIG. 1, constant current sources 9, 11, 13, and 17 and current source switches 20, 21, 22, 23, 24, 25, 26, and 27 draw two output currents, $I_E$ and $I_L$ (also shown in FIG. 2). $I_E$ is the sum of the current that passes through the input switches 1 and 2. Input switches 1 and 2 are comprised of two n-channel transistors 41 and 43 in FIG. 2. The gate of transistor 41 receives the input signal E and the gate of transistor 43 receives the input signal bE, which is the complement of signal E. The source of transistors 41 and 43 are connected to the drain of the n-channel transistors 32, 34, 36, and 38.

$I_L$ is the sum of the current that passes through input switches 3 and 4. Input switches 3 and 4 are comprised of two n-channel transistors, 42 and 44 in FIG. 2. The gate of transistor 42 receives the input signal L and the gate of transistor 44 receives the input signal bL, which is the complement of signal L. The sources of transistors 42 and 44 are connected to the drains of n-channel transistors 31, 33, 35, and 37. The drain terminals of transistor 41 and transistor 42 are connected to a load 61. The drain terminals of transistor 43 and transistor 44 are connected to a load 62. Load 61 and load 62 are of equal resistance in this embodiment. The current through each of the loads is equal to $I_{LOAD}$.

Output signal OUT is measured at a node 19 between load 62 and transistors 43 and 44 (FIG. 2). Node 19 has a capacitor 52 connected to ground. A complement to output signal OUT, namely output signal OUTB, is measured at a node 18 between load 61 and transistors 41 and 42. Node 18 has a capacitor 51 connected to ground. As described below, the charging and discharging of capacitor 51 and capacitor 52 is used by fine delay circuit 10 to create fine delay steps. The proper selection of capacitor 51 and capacitor 52 is made to allow for charging and discharging of the capacitors at high frequencies. Capacitor 51 and capacitor 52 may be hidden in the input load of the next gate stage connected to node 18 and node 19, respectively. In this configuration, fine delay circuit 10 has current $I_{LOAD}=I_E+I_L=I_1+I_2+I_3+I_4=15I_1$.

Referring to FIGS. 4A–4B and 5A–5B, the phase shift between signal E and OUT is adjusted in fine steps by current source switches 20, 21, 22, 23, 24, 25, 26, and 27. For example, referring to FIGS. 4A and 5A, when switch signals S0–S3 are at a minimum voltage designated as "0000", complementary signals bS0–bS3 are at a maximum voltage designated as "1111". This condition corresponds to current source switches 20, 22, 24, 26 switches being open and current source switches 21, 23, 25, and 27 being closed. All of the current generated from constant current sources 9, 11, 13, and 17 maximizes current $I_E$ while current $I_L$ is zero. Therefore, $I_E=I_{LOAD}=15I_1$. This produces a minimum phase shift delay between signal OUT relative to signal E.

Figure 4A:
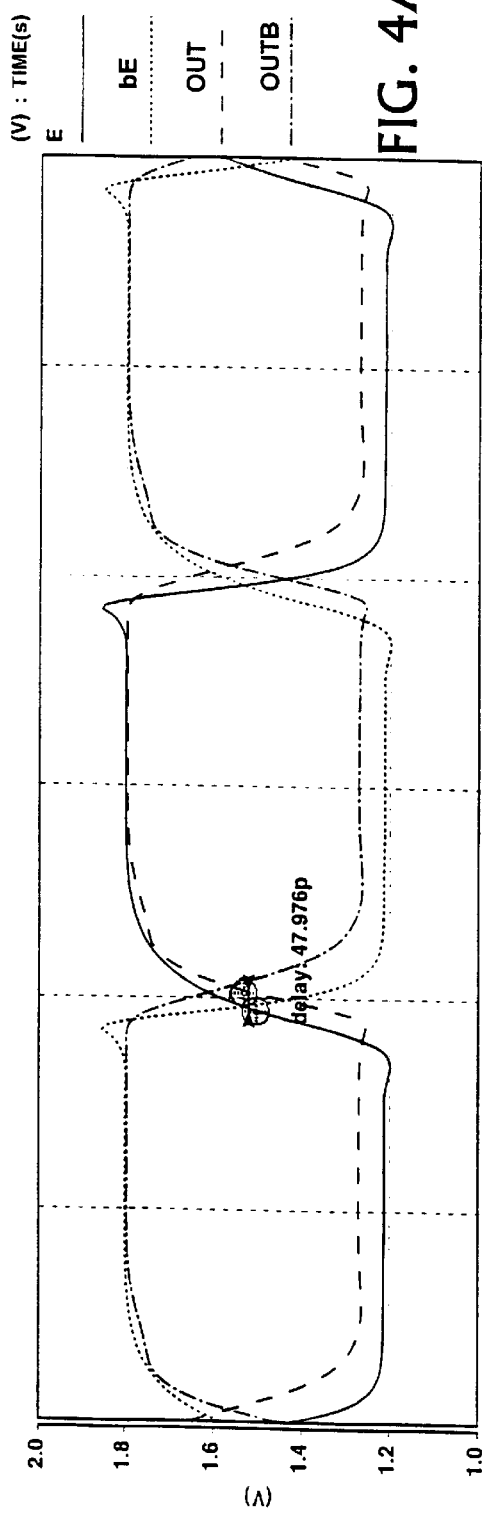
FIG. 4A is a graph of the phase relationship between input signal E and output signal OUT when signals S0–S3 (FIG. 2) are low.
Figure 4B:
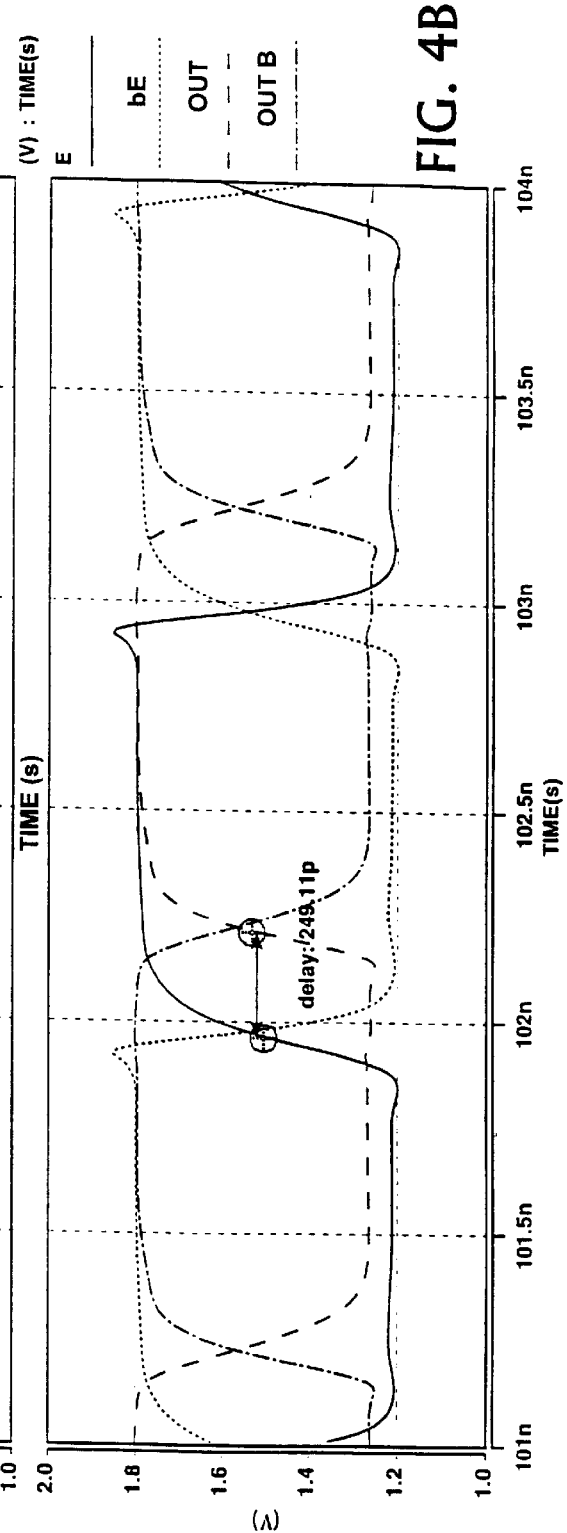
FIG. 4B is a graph of the phase relationship between the input signal E and the output signal OUT when signals S0–S3 are high.
Figure 6A:
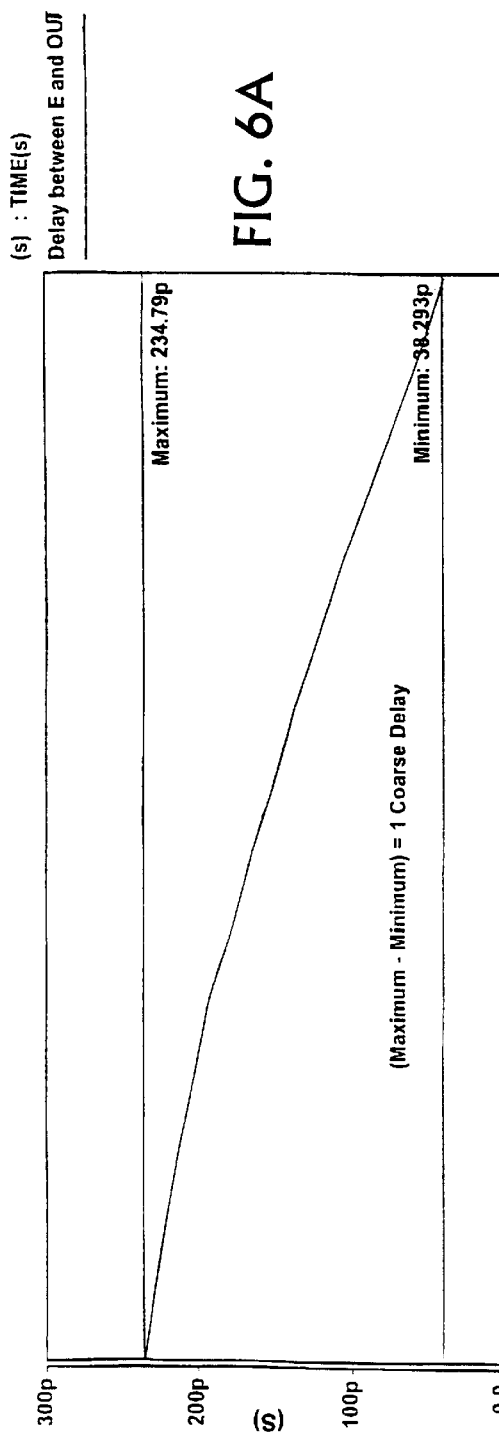
FIGS. 6a and 6b are graphs of the relationship of $I_E$ and $I_L$ with respect to the phase delay between E and OUT.
Figure 6B:
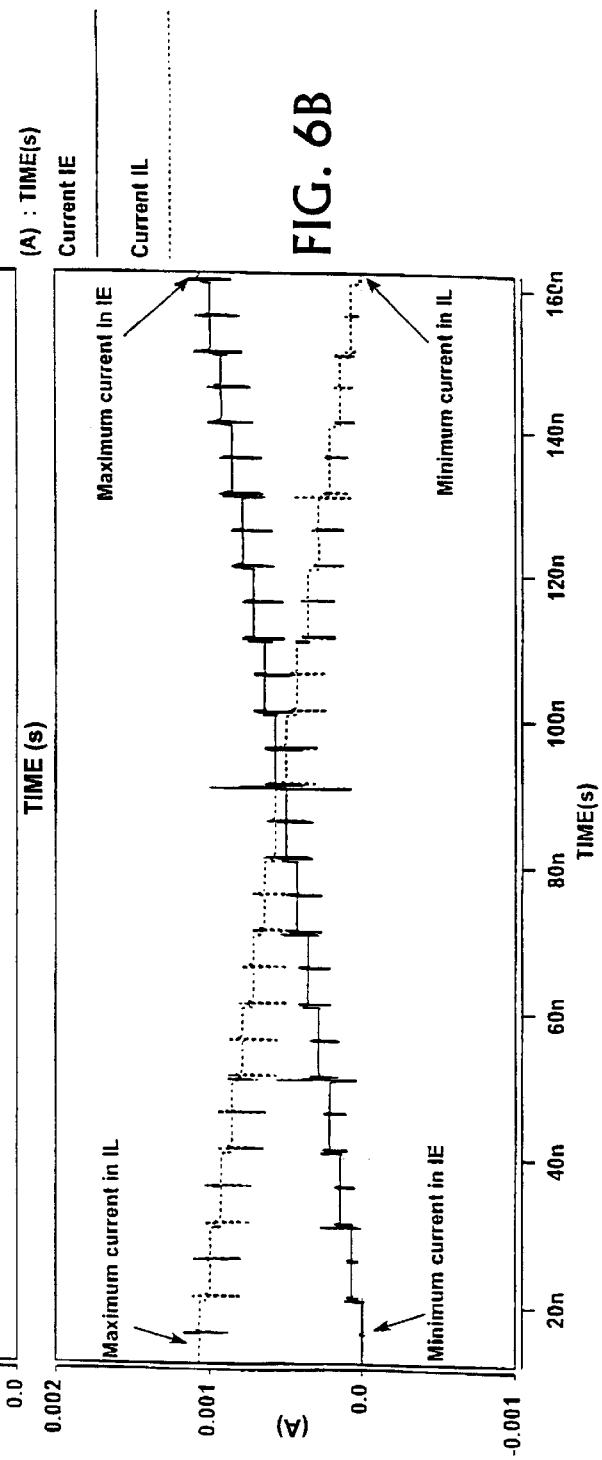

Referring to FIGS. 4B and 5B when signals S0–S3 are at a maximum voltage (1111), complementary signals bS0–bS3 are zero voltage (0000). All of the current generated from constant current sources $I_1$, $I_2$, $I_3$, and $I_4$ maximizes the current $I_L$ while current $I_E$ is zero. Therefore, $I_L=I_{LOAD}=15I_1$. This produces a maximum phase shift delay between OUT relative to E. The difference of the minimum phase delay and the maximum phase delay is equal to coarse delay T. Referring to FIG. 6A and 6B, as $I_E$ moves from a minimum to a maximum value the delay between signals E and OUT decreases linearly.

Referring to FIG. 7, the creation of the fifteen fine delay steps can be generated by adjusting signals at S0–S3 from voltages 0000 to 1111. FIG. 7 shows four stages of the sixteen stages. At Rise 1, the edge is defined by switch settings being set at S0–S3=0000 and bS0–bS3=1111. Thus, the current becomes $I_E=15I_1$, and $I_L=0$. When signal bE goes low at tRE, node 19 is pulled-up through the resistor load resulting in Rise 1 having the fastest edge of the sixteen stages. Even if the signal bL goes low after a delay of one course delay, it will not affect node 19 because current $I_L$ is zero. At Fall 1, when bE goes high at tFE, node 19 discharges. Since all the current is in $I_E$ the discharge is the fastest of the sixteen stages.

At Rise 2 the switches are set as S0–S3=1010 and bS0–bS3=0101. The current becomes $I_E=10I_1$ and $I_L=5I_1$. When signal bE goes low at tRE, the charging of node 19 starts but since signal bL is high for one course delay after bE goes low, the current $I_L$ tries to pull node 19. Thus, the rising of node 19 is slower until signal bL is high. Once bL goes low at tRL, the node 19 gets charged with the same slope as in the case of rise 1.

At Fall 2, when the signal bE goes high at tFE the node 19 starts discharging current $I_E$ which is now less than in the case of Rise 1 so that the discharge is slower until signal bL goes high. Once signal bL goes high at tFL, current $I_L$ is added on to the discharge current and the node 19 discharges faster.

At Rise 3, the switches are set as S0–S3=0101 and bS0–bS3=1010. The current becomes $I_E=5I_1$ and $I_L=10I_1$. The function is the same as Rise 2 except that the values of the currents $I_E$ and $I_L$ are different which slows the rate of charging. Likewise, Fall 3 functions the same as Fall 2 except that the change in current slows the rate of discharging.

At Rise 4, the switches are set as S0–S3=1111 and bS0–bS3=0000. The current becomes $I_E=0$ and $I_L=15I_1$. In this case signal bE has no effect because $I_E=0$. The charging of node 19 begins only when signal bL goes low at tRL, which is the slowest rising edge of the sixteen stages. During Fall 4, the node 19 discharges only when bL goes high at tFL, which is the slowest falling edge of the sixteen falling edges.

FIG. 7 also shows the signal OUT2, which is the output voltage of an inverter connected to node 19. The signal OUT (signal at node 19) crosses the voltage level VINV at different points in time according to the switch settings. VINV is the input threshold voltage of the inverter when the output of the inverter switches.

Figure 8A:
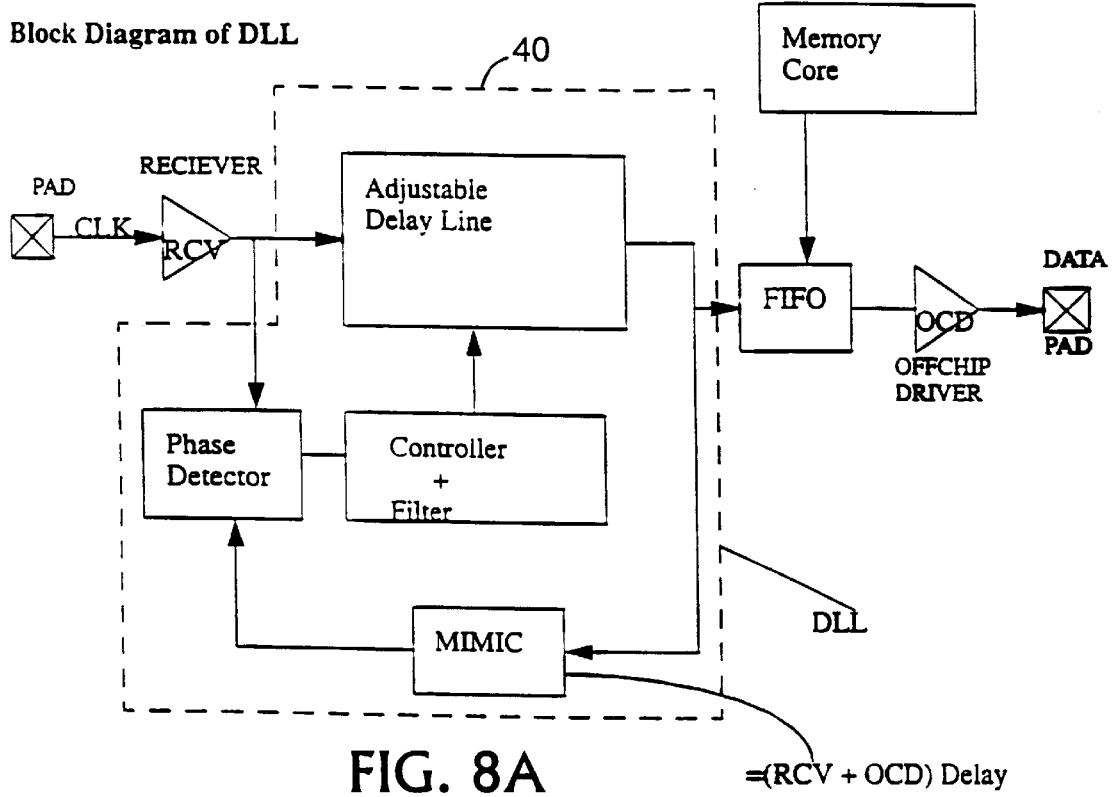
FIG. 8A is a general block diagram of a typical DLL
Figure 8B:
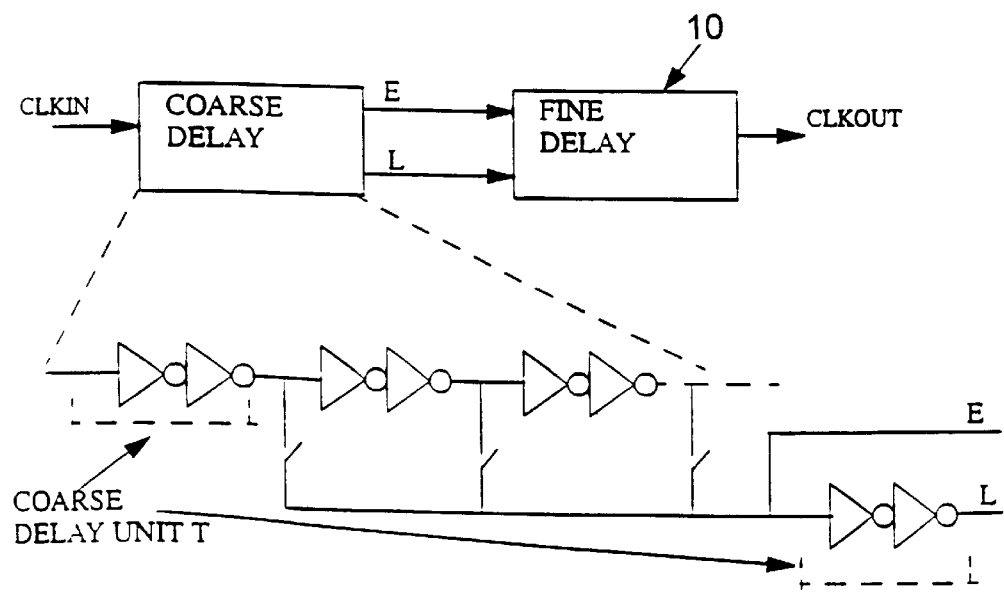
FIG. 8B is a general block diagram showing the usage of the fine delay circuit of FIG. 1.

FIG. 8A shows a block diagram of the typical DLL 40 in a circuit. FIG. 8B shows fine delay circuit 10 incorporated into a DLL block in which an input clock signal CLKIN produces a phase-shifted output clock signal CLKOUT.

Other embodiments include varying the amount of fine delay steps, where a fine step is equal to $2^N$ and where N equals the number of binary weighted constant current sources. Also, p-channel transistors can be substituted for the n-channel transistors shown in the figures.

Other embodiments not described here are also within the scope of the following claims.

What is claimed is:

1. A circuit, for use in a delay locked loop, which provides a phase-shifted output relative to a first signal, the circuit comprising:
    plural current sources;
    current source switches that are selectable to transmit varying amounts of current from the plural current sources; and
    input switches that receive current via the current source switches and provide the phase-shifted output, the input switches comprising a first input switch receiving the first signal and a second input switch receiving a second signal phase-shifted from the first signal;
    wherein the phase-shifted output is based on an amount of current that passes through each of the input switches.

2. The circuit of claim 1, wherein each current source comprises a constant current source.

3. The circuit of claim 1, wherein the plural current sources comprise a first current source and a second current source the second current source generating twice as much current as the first current source.

4. The circuit of claim 3, wherein each additional current source generates current $2^N$ times greater than the first current source.

5. The circuit of claim 1, wherein each current source includes a first transistor.

6. The circuit of claim 1, wherein each current source switch includes a first transistor and a second transistor.

7. The circuit of claim 6, wherein the second transistor receives a fourth signal complementary to a third signal received by the second transistor.

8. The circuit of claim 1, wherein the first input switch comprises a first transistor and a second transistor.

9. The circuit of claim 8, wherein the second input switch comprises a third transistor and fourth transistor.

10. The circuit of claim 8, wherein the first transistor receives the first signal and the second transistor receives a third signal complementary to the first signal.

11. The circuit of claim 9, wherein the third transistor receives the second signal and the fourth transistor receives a fourth signal complementary to the second signal.

12. A method for providing a phase-shifted output relative to a first signal in a delay locked loop, comprising:
    selecting varying amounts of current from plural current sources by enabling current source switches; and
    transmitting a first signal to a first input switch and a second signal phase-shifted from the first signal to a second input switch;
    wherein the phase-shifted output relative to a first signal is based on an amount of current that passes through the first input switch and the second input switch.

13. The method of claim 12, wherein each current source comprises a constant current source.

14. The method of claim 12, wherein the plural current sources comprise a first current source and a second current source the second current source generating twice as much current as the first current source.

15. The method of claim 14, wherein each additional current source generates current $2^N$ times greater than the first current source.

16. The method of claim 12, wherein each current source includes a first transistor.

17. The method of claim 12, wherein each current source switch includes a first transistor and a second transistor.

18. The method of claim 17, wherein the second transistor receives a fourth signal complementary to a third signal received by the second transistor.

19. The method of claim 12, wherein the first input switch comprises a first transistor and a second transistor.

20. The method of claim 19, wherein the second input switch comprises a third transistor and fourth transistor.

21. The method of claim 19, wherein the first transistor receives the first signal and the second transistor receives a third signal complementary to the first signal.

22. The method of claim 21, wherein the third transistor receives the second signal and the fourth transistor receives a fourth signal complementary to the second signal.

* * * * *